(12) United States Patent
Spoettl et al.

(10) Patent No.: US 9,935,042 B2
(45) Date of Patent: Apr. 3, 2018

(54) SEMICONDUCTOR PACKAGE, SMART CARD AND METHOD FOR PRODUCING A SEMICONDUCTOR PACKAGE

(71) Applicant: Infineon Technologies AG, Neubiberg (DE)

(72) Inventors: Thomas Spoettl, Mintraching (DE); Frank Pueschner, Kelheim (DE); Guenther Ruhl, Regensburg (DE); Peter Stampka, Burglengenfeld (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/609,136

(22) Filed: May 31, 2017

(65) Prior Publication Data

US 2017/0345740 A1 Nov. 30, 2017

(30) Foreign Application Priority Data

May 31, 2016 (DE) .......................... 10 2016 109 960

(51) Int. Cl.
| | |
|---|---|
| *H01L 23/48* | (2006.01) |
| *H01L 23/498* | (2006.01) |
| *H01L 25/065* | (2006.01) |
| *H01L 23/367* | (2006.01) |
| *H01L 23/495* | (2006.01) |

(Continued)

(52) U.S. Cl.
CPC .......... *H01L 23/498* (2013.01); *G06K 19/072* (2013.01); *G06K 19/077* (2013.01); *H01L 23/34* (2013.01); *H01L 23/3675* (2013.01); *H01L 23/49537* (2013.01); *H01L 24/73* (2013.01);

(Continued)

(58) Field of Classification Search
CPC ... H01L 23/498; H01L 23/34; H01L 23/3675; H01L 23/49537; H01L 24/73; H01L 25/0657; H05K 1/113; G06K 19/072; G06K 19/077
See application file for complete search history.

(56) References Cited

U.S. PATENT DOCUMENTS

| | | | |
|---|---|---|---|
| 7,598,622 B2 * | 10/2009 | Mengel | H01L 23/3121 257/618 |
| 7,880,248 B1 * | 2/2011 | Pham | H01L 23/573 257/417 |

(Continued)

OTHER PUBLICATIONS

Shashank.S.Pandey & Carlos.H.Mastrangelo, An Exothermal Energy Release Layer for Microchip Transience, 2013, IEEE.*

(Continued)

*Primary Examiner* — Nicholas Tobergte
(74) *Attorney, Agent, or Firm* — Viering, Jentshura & PartnermbB

(57) ABSTRACT

A semiconductor package includes a chip, a layer which is thermally coupled to the chip and which is formed from a material having a triggering temperature of greater than or equal to 200° C., starting from which an exothermic reaction takes place, and encapsulating material which at least partly covers the chip and the layer. The layer is configured in such a way and is arranged relative to the chip in such a way that, in the case of a triggered exothermic reaction of the material of the layer, at least one component of the chip is damaged on account of the temperature increase caused by the exothermic reaction.

9 Claims, 4 Drawing Sheets

(51) Int. Cl.
*G06K 19/07* (2006.01)
*G06K 19/077* (2006.01)
*H05K 1/11* (2006.01)
*H01L 23/00* (2006.01)
*H01L 23/34* (2006.01)

(52) U.S. Cl.
CPC .......... *H01L 25/0657* (2013.01); *H05K 1/113* (2013.01)

(56) References Cited

U.S. PATENT DOCUMENTS

| | | | | |
|---|---|---|---|---|
| 9,711,464 | B2 * | 7/2017 | Cooney | H01L 23/573 |
| 2001/0033012 | A1 * | 10/2001 | Kommerling | G06F 21/86 |
| | | | | 257/679 |
| 2003/0024994 | A1 | 2/2003 | Ladyansky | |
| 2004/0244889 | A1 * | 12/2004 | Sailor | C06B 33/00 |
| | | | | 149/2 |
| 2005/0001214 | A1 * | 1/2005 | Brun | G06K 19/073 |
| | | | | 257/59 |
| 2008/0307992 | A1 * | 12/2008 | Mohler | F42B 3/00 |
| | | | | 102/202.6 |
| 2009/0307896 | A1 | 12/2009 | Snyder et al. | |
| 2011/0089506 | A1 * | 4/2011 | Hoofman | G06F 21/87 |
| | | | | 257/417 |
| 2011/0127314 | A1 * | 6/2011 | Heinrich | B23K 1/0006 |
| | | | | 228/123.1 |
| 2012/0068326 | A1 * | 3/2012 | Das | H01L 23/42 |
| | | | | 257/687 |
| 2014/0103485 | A1 * | 4/2014 | Fritz | H01L 23/5252 |
| | | | | 257/530 |
| 2014/0103957 | A1 * | 4/2014 | Fritz | H01L 23/576 |
| | | | | 326/8 |
| 2016/0088756 | A1 | 3/2016 | Ramadas | |

OTHER PUBLICATIONS

Wikipedia, "Lithium-Ionen-Akkumulator", May 30, 2016 (retrieved on Feb. 2, 2017, English translation retrieved on May 31, 2017), https://de.wikipedia.org/wiki/Lithium-Ionen-Akkumulator.

\* cited by examiner

SEMICONDUCTOR PACKAGE, SMART CARD AND METHOD FOR PRODUCING A SEMICONDUCTOR PACKAGE

CROSS-REFERENCE TO RELATED APPLICATION

This application claims priority to German Patent Application Serial No. 10 2016 109 960.0, which was filed May 31, 2016, and is incorporated herein by reference in its entirety.

TECHNICAL FIELD

Various embodiments relate generally to semiconductor packages such as are employed in use on printed circuit boards in a wide variety of applications, but also smart card modules such as are employed in the production of smart cards, and a method for producing the semiconductor packages.

BACKGROUND

Smart cards, whether they are contactless and/or have contacts, are used inter alia in cashless payment transaction or as access authorization. The smart cards usually include a smart card module (FIG. 1A illustrates by way of example an at least inter alia contactless smart card module 100), having a chip 110 for storing and/or processing the confidential data or data having a monetary value, which chip for forming the smart card 101 can be arranged in a smart card body 220 (see FIG. 1B: the smart card body 220 is also equipped with a booster antenna 222 by way of example for an at least inter alia contactless utilization, said booster antenna comprising a chip coupling region 224, within which the smart card module 100 can be arranged). The chip can be mounted on a chip carrier 116, e.g. a substrate or a leadframe, and can customarily be encapsulated (not visible in the schematic plan view) in order to protect the contacting and the chip 110 against mechanical loads.

The encapsulation is usually formed by a covering compound or an encapsulation material being applied to the already mounted and contacted chip 110. The encapsulation can be formed for example as so-called glob top applied by dispensing, or a so-called mold cap formed by applying a molding compound under high pressure.

In some smart card modules or smart cards, however, an external access to the chip may be possible. External access means that the chip can be exposed chemically, mechanically, by a laser and/or plasma and can be contacted externally in the functioning state. Such methods are used for manipulating chips or e.g. to read out the data stored in the chip 110. One aim of such attacks may also be to ascertain the chip design for reproductions. Another conceivable aim of the attack is to use the chip 110 improperly in some other way.

An attack includes stripping away the chip encapsulation in such a way that the chip 110 is exposed as far as possible without being destroyed and such that it still functions electrically. The unprotected chip 110 can then be examined with regard to its mode of functioning and the stored data during its operation by physical attacks. The physical attacks may include for example so-called "probing", in which the signals of the chip are tapped off and evaluated. In so-called "forcing" the conductor tracks of the chip are rewired at a microscopic level in order to manipulate the functional sequence of the chip.

On the part of the electrical industry, particularly in the field of pay television, also referred to as pay TV, and cashless payment transactions, there is great interest in preventing attacks on the corresponding chips. Companies incur great financial losses owing to manipulation of the semiconductor chips used for decrypting the pay TV programs broadcast in an encrypted fashion.

A further field that is particularly affected by smart card manipulations is the field of credit and cash cards. Owing to the improper manipulation of credit cards or cash cards, the affected companies and/or card holders incur financial damage.

Another field of application in which the smart cards should be protected against manipulation is the storage of security-relevant or sensitive data, for example in smart cards used as access authorization, electronic passports or patient cards having data concerning medical history.

Without additional protection of the chip surface, the chip 110 can be attacked as soon as the encapsulation (e.g. the molding compound) has been removed.

Such attacks may generally concern any type of packaged, e.g. encapsulated, semiconductor components (e.g. chips), also referred to as semiconductor packages: in addition to the smart card modules described, for example, including semiconductor packages which can be used on printed circuit boards in a wide variety of applications.

SUMMARY

A semiconductor package includes a chip, a layer which is thermally coupled to the chip and which is formed from a material having a triggering temperature of greater than or equal to 200° C., starting from which an exothermic reaction takes place, and encapsulating material which at least partly covers the chip and the layer. The layer is configured in such a way and is arranged relative to the chip in such a way that, in the case of a triggered exothermic reaction of the material of the layer, at least one component of the chip is damaged on account of the temperature increase caused by the exothermic reaction.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1A:
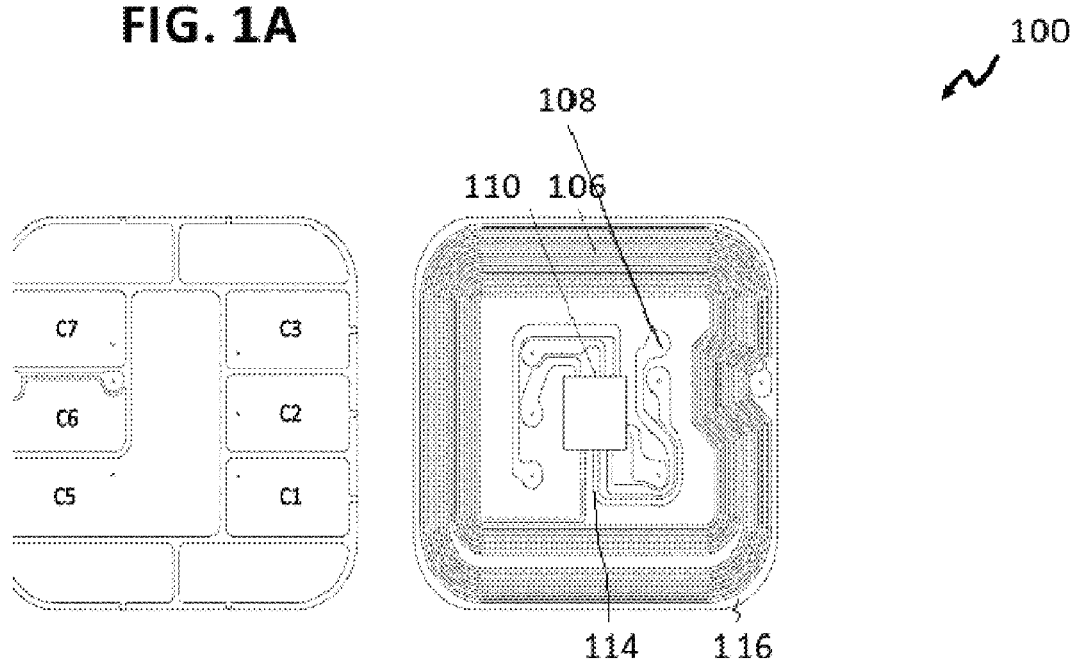
FIGS. 1A and 1B show a schematic illustration of a smart card module and a smart card.
Figure 1B:
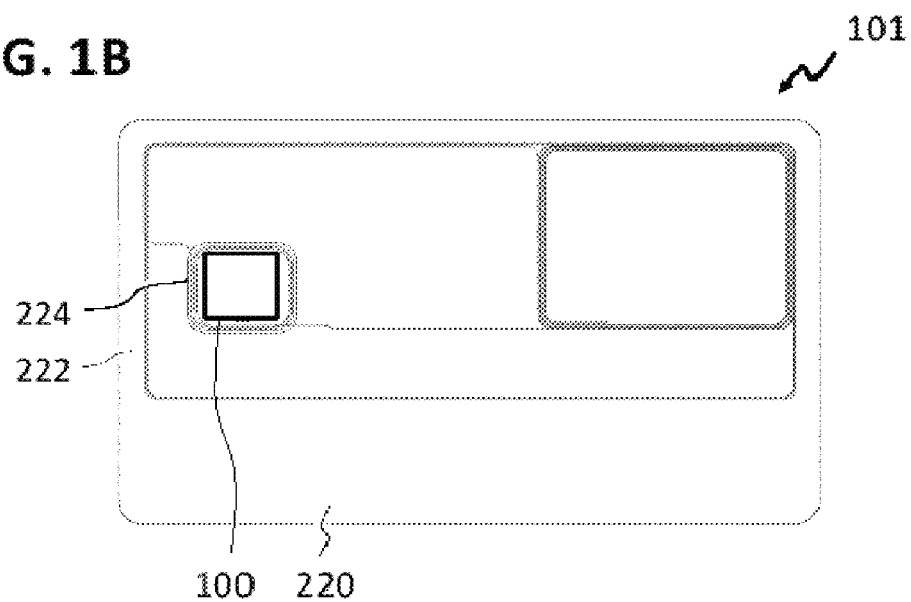

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear" etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

In various embodiments, the chip can be protected against external accesses.

In various embodiments, the chip can additionally be at least partly shrouded, e.g. covered, with a thermodynamically metastable layer in which an exothermic chemical reaction is triggered upon an attack by the supply of energy. The resulting heat of reaction may be so high that it damages the chip (that is to say that the chip may no longer have a function). Consequently, the chip can no longer be addressed externally.

In various embodiments, a material of the layer on the chip can be thermodynamically metastable, that is to say that the material can decompose if its activation energy is exceeded. The decomposition can take place strongly exothermically, i.e. with vigorous evolution of heat.

In various embodiments, a heat may be so high locally that the active layer of the chip (or at least part thereof) is irreversibly destroyed.

In various embodiments, the layer can be fashioned such that it does not begin to react, i.e. the exothermic reaction is triggered, during production (e.g. during an encapsulation process, e.g. during molding), or e.g. in reliability tests. The activation energy of the thermodynamically metastable material can have an effect of bringing about a temperature of more than approximately 200° C. In this case, the activation energy can be substantially independent of a time duration of the temperature influence. To put it another way, it may be necessary for a temperature below the activation temperature also to be able to act on the semiconductor package for a relatively long time duration, e.g. several minutes or several hours, without the exothermic reaction being triggered.

In various embodiments, the layer can be arranged, e.g. deposited, on the chip for example by means of paste printing, sol-gel deposition, vapor deposition, e.g. physically (PVD) or chemically (CVD), or by means of other known methods.

In various embodiments, the layer can be encapsulated by a highly crosslinked molding compound, for example with a molding compound as described in U.S. Pat. No. 7,598, 622 B2 or in DE 10 2005 043 657 B4. In a case that involves attempting to remove the highly crosslinked molding compound by means of grinding, a laser and/or plasma etching for an attack on the chip, energy is released which can be sufficient to trigger the exothermic reaction in the layer. To put it another way, exposing the chip by removing the highly crosslinked molding compound can necessitate expending energy that suffices to exceed the activation energy of the layer.

In various embodiments, a semiconductor package is provided. The semiconductor package may include a chip, a layer which is thermally coupled to the chip and which is formed from a material having a triggering temperature of greater than or equal to 200° C., starting from which an exothermic reaction takes place, and encapsulating material which at least partly covers the chip and the layer. The layer can be configured in such a way and can be arranged relative to the chip in such a way that, in the case of a triggered exothermic reaction of the material of the layer, at least one component of the chip is damaged on account of the temperature increase caused by the exothermic reaction.

In various embodiments, the layer can be a thermodynamically metastable inorganic layer.

In various embodiments, the material of the thermodynamically metastable inorganic layer can be an Li-based compound.

In various embodiments, the Li-based compound can be an Li metal oxide.

In various embodiments, the Li-based compound can be an Li-based compound including one or more transition metals.

In various embodiments, the layer can have a layer thickness of at least 10 μm.

In various embodiments, the encapsulating material may include or can be formed from a highly crosslinked encapsulating material.

In various embodiments, a temperature increase by at least 400° C. can take place at the at least one component of the chip.

In various embodiments, upon triggering of an exothermic reaction of the material of the layer, the triggered exothermic reaction can take place in an oxygen-containing environment.

In various embodiments, a method for producing a semiconductor package is provided. The method may include: thermally coupling a layer to a chip, which layer is formed from a material having a triggering temperature of greater than or equal to 200° C., starting from which an exothermic reaction takes place, and at least partly covering the chip and the layer with an encapsulating material. The layer can be configured in such a way and can be arranged relative to the chip in such a way that, in the case of a triggered exothermic reaction of the material of the layer, at least one component of the chip can be damaged on account of the temperature increase caused by the exothermic reaction.

In various embodiments, a smart card is provided. The smart card may include a smart card body and a semiconductor package in accordance with various embodiments.

Figure 2A:
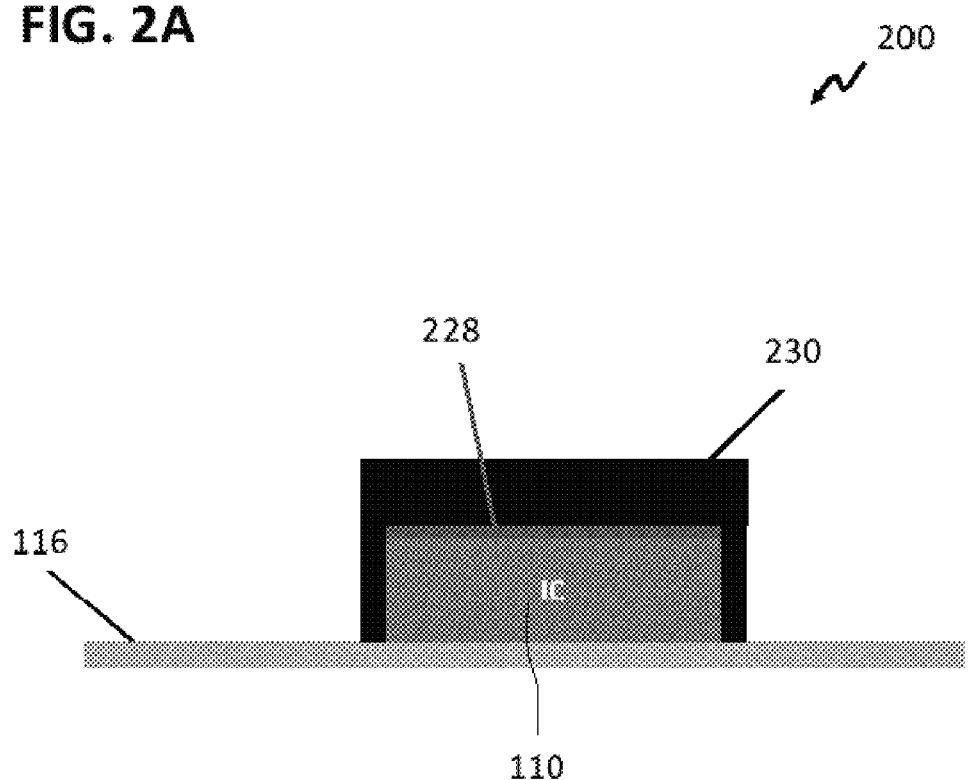
FIG. 2A shows a schematic cross-sectional view of a semiconductor package in accordance with various embodiments.

FIG. 2A shows a schematic cross-sectional view of a semiconductor package 200 in accordance with various embodiments.

The semiconductor package 200, apart from differences described below, can substantially correspond to the smart card module 100 from FIG. 1A, for example with regard to components, materials, functions, arrangements etc., wherein in the case of use for purposes other than for a smart card module, the semiconductor package 200 need not include the elements specific to smart card modules, such as e.g. a module antenna 106.

The chip 110 may include an arbitrary semiconductor chip, independently of a chip technology and a surface (PI, SiN, etc.) or be such an arbitrary semiconductor chip.

The chip 110 can be arranged on a chip carrier 116. The chip carrier 116 may include or essentially consist of a substrate, for example an inorganic or organic substrate, for example a polymer, e.g. PET or PI, or any other suitable substrate. By way of example, the substrate may include a flexible substrate, a leadframe, a printed circuit board, or the like.

In various embodiments, the semiconductor package 200 may include a layer 228 that can be thermally coupled to the chip 110. The layer 228 can be arranged for example such that it at least partly covers the chip 110. In various embodiments, the layer 228 can cover, for example completely, for example a side of the chip 110 facing away from a carrier 116. In various embodiments, the layer 228 can cover part of the side of the chip 110 facing away from the carrier 116, for example at one or more locations at which there are arranged in the chip 110 such structures which can be damaged the most easily by heat, for example by thermal energy which can be released during an exothermic reaction of material of the layer 228. In various embodiments, the layer 228 can at least partly cover, for example additionally, further sides of the chip 110.

In various embodiments, the layer 228 can be arranged in direct contact with the chip 110.

In various embodiments, at least one additional layer can be arranged (not illustrated) between the chip 110 and the layer 228. The at least one additional layer can for example include an adhesion promoter, or include some other functional component, or consist thereof. In this case, the additional layer can be fashioned such that it does not impair, or impairs insignificantly at most, the thermal coupling of the layer 228 to the chip 110 and heating of the chip 110 by an exothermic reaction taking place in the layer 228.

In various embodiments, the layer 228 can be formed from a material which has a triggering temperature of approximately greater than or equal to 200° C., starting from which an exothermic reaction takes place.

In various embodiments, the material of the layer 228 on the chip 110 can be thermodynamically metastable, that is to say that it can decompose if its activation energy is exceeded. The decomposition can take place strongly exothermically, i.e. with vigorous evolution of heat. In this case, the heat locally can be so high that an active layer (or at least part thereof) of the chip 110 is irreversibly destroyed. The layer 228 can be fashioned such that it does not begin to react during production (e.g. during molding) or in reliability tests. By way of example, an activation energy of >190° C. can be necessary for this purpose. In this case, the process temperature can be maintained for a relatively long time (several minutes or hours), without the exothermic reaction occurring. To put it another way, it is possible to rule out a triggering of the exothermic reaction by a temperature below the triggering temperature independently of the time duration of the action.

In various embodiments, the exothermic reaction can be a chemical reaction with oxygen, for example with oxygen which can be present in an atmosphere surrounding the layer 228.

In various embodiments, the layer 228 can be formed from a thermodynamically metastable material, for example from a thermodynamically metastable inorganic material, for example from a thermodynamically metastable lithium (Li) compound, for example from a substoichiometric $Li_{1-x}(Co, Ni, Mil))O_2$.

Figure 3:
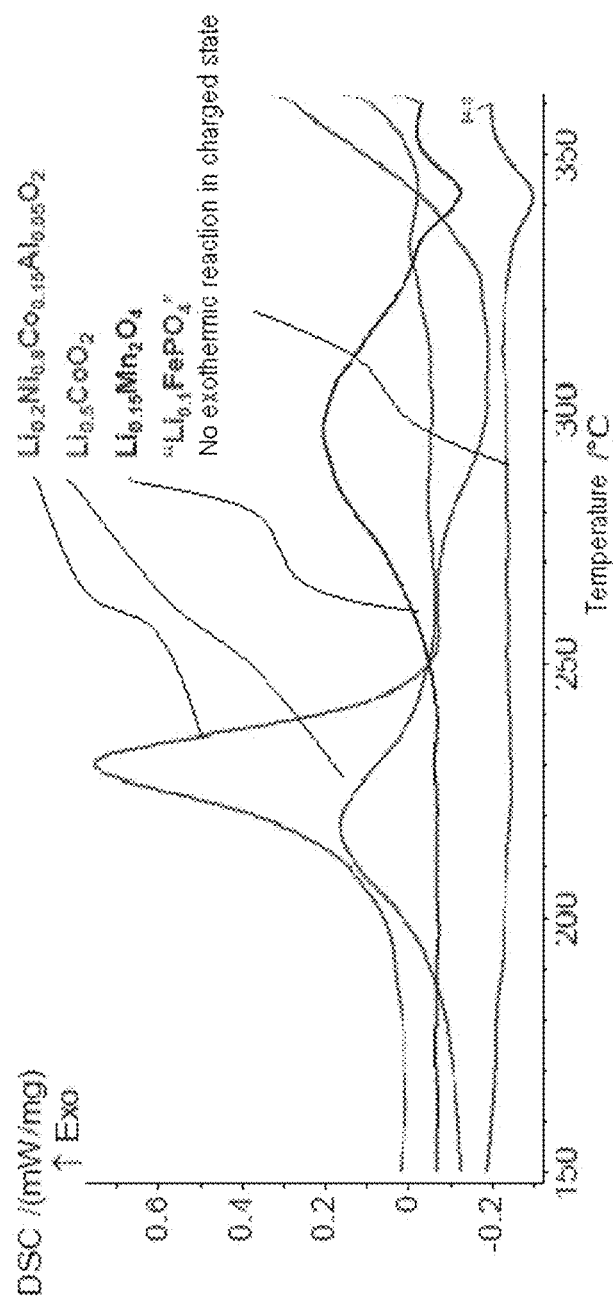
FIG. 3 shows a graphical illustration of onset temperatures of the exothermic decomposition of various metastable Li compounds.

In various embodiments, the layer 228 may include for example $Li_{0.2}Ni_{0.8}Co_{0.15}Al_{0.05}O_2$ and/or $Li_{0.5}CoO_2$ and/or $Li_{0.15}Mn_2O_4$, the respective activation temperature profile (dynamic differential calorimetry in mW/mg as a function of the temperature in ° C.) of which is illustrated in FIG. 3, and/or $LiNiO_2$ and/or $Li_{0.45}CoO_2$. In FIG. 3 it can be discerned that the activation temperature for each of the materials illustrated has a range instead of a sharp value. By way of example $Li_{0.2}Ni_{0.8}Co_{0.15}Al_{0.05}O_2$, which is a metastable lithium compound, can have an onset temperature for an exothermic decomposition of approximately 230° C. (with a range of approximately 210° C. to approximately 240° C.). $Li_{0.5}CoO_2$, a further metastable lithium compound, can have an onset temperature for an exothermic decomposition of approximately 218° C. (with a range of approximately 196° C. to approximately 240° C.) $Li_{0.15}Mn_2O_4$, a further metastable lithium compound, can have an onset temperature for an exothermic decomposition of approximately 295° C. (with a range of approximately 260° C. to approximately 320° C.)

That is to say that an exothermic reaction of $Li_{0.2}Ni_{0.5}Co_{0.15}Al_{0.05}O_2$ can be triggered for example by means of temperatures acting in the range starting from approximately 210° C. to 240° C., for example of approximately 230° C. An exothermic reaction of $Li_{0.5}CoO_2$ can be triggered for example by means of temperatures acting in the range starting from approximately 196° C. to 240° C., for example of approximately 218° C. An exothermic reaction of $Li_{0.15}Mn_2O_4$ can be triggered for example by means of temperatures acting in the range starting from approximately 260° C. to 320° C., for example of approximately 295° C.

In various embodiments, a stability of the compound (and thus the triggering temperature of more than approximately 200° C.) can be set by way of transition metal types in the compound and an Li stoichiometry factor x. That is to say that apart from the above-mentioned compounds illustrated by way of example in FIG. 3 for the layer 228 it is also possible to use other thermodynamically metastable compounds, for example other Li compounds.

In various embodiments, the layer 228 can be fashioned, for example the material or the material composition of the layer 228 can be chosen, such that the exothermic reaction of the layer 228 is not triggered during production of the semiconductor package 200 and, if appropriate, during production of a smart card (see FIG. 2B) using the semiconductor package 200. That is to say that the layer 228 can be fashioned such that, during processes which are carried out during or after a process of arranging the layer 228, the semiconductor package 200 can be heated up to temperatures that are customary in process engineering terms, for example to temperatures of up to approximately 150° C., for example up to approximately 160° C., for example approximately up to 170° C., for example up to approximately 180° C., for example approximately up to 190° C., without the exothermic reaction being triggered. By way of example, encapsulating the semiconductor package 200, e.g. molding, can lead to a temperature increase in the chip 110, for example to a temperature increase of up to approximately 190° C.

In various embodiments, the layer 228 can be fashioned such that the temperature that is customary in process engineering terms can be maintained for a relatively long period of time, e.g. up to approximately 10 minutes, e.g. up to approximately 15 minutes, e.g. up to approximately 30 minutes, e.g. up to approximately 1 hour, e.g. up to approximately 2 hours, without the exothermic reaction being triggered.

In various embodiments, the material or the material composition of the layer 228 can be coordinated with the process temperatures to be expected during the production of the semiconductor package 200 or of the smart card 201. If production processes are expected, for example, which lead to a temperature increase of the chip 110 to more than approximately 190° C., the material or the material composition of the layer 228 can be fashioned such that the activation temperature, for example the lowest temperature in the range of the activation temperature (see e.g. FIG. 3 and associated description), has a minimum separation sufficient to avoid the triggering of the exothermic reaction at the expected process temperatures. By way of example, the minimum separation can be approximately 10° C., for example approximately 15° C., for example approximately 20° C., for example approximately 40° C., for example approximately 70° C.

In various embodiments, the layer 228 can be configured in such a way and can be arranged relative to the chip 110 in such a way that, in the case of a triggered exothermic reaction of the material of the layer 228, at least one component of the chip 110 is damaged on account of the temperature increase caused by the exothermic reaction.

The temperature increase caused by the exothermic reaction can be for example at least 400° C., for example at least 450° C., for example at least 500° C., for example at least 700° C., for example at least 800° C., for example at least 1000° C. In the case of a temperature increase of at least approximately 1000° C., in the case of which the chip 110 can be heated at least partly, i.e. in at least one region, to more than 1000° C., a metalization and an implantation profile of the chip 110 can be destroyed.

In various embodiments, the at least one region of the chip 110 in which a temperature increase can take place, upon the triggering of the exothermic reaction in the layer 228, can be a vertical partial region of the chip 110, for example a vertical partial region of the chip 110 which has a thickness of a few μm (e.g. approximately 4 to 6 μm) and which extends from an active side of the chip 110 into the chip 110. In this case, the layer 228 can be thermally coupled to the active side of the chip 110.

In various embodiments, the at least one region of the chip 110 in which a temperature increase can take place, upon the triggering of the exothermic reaction in the layer 228, can be a lateral partial region of the chip 110.

In order to increase the temperature in the chip 110, upon the triggering of the exothermic reaction in the layer 228. In various embodiments, the layer 228 can be thermally coupled to the chip 110. The layer 228 can be arranged for example directly on the chip 110. In various embodiments, the layer 228 can be indirectly connected to the chip 110, for example by a thermally conductive material, for example by a thermally conductive connection layer (not illustrated).

In various embodiments, the layer 228 can have a thickness in a range of approximately 20 μm to approximately 200 μm, for example of approximately 20 μm to approximately 100 μm, for example of approximately 25 μm to approximately 75 μm.

In various embodiments, the layer 228 can have a thickness which is approximately one to four times the thickness of the chip 110, for example approximately double the thickness of the chip 110.

In various embodiments, the layer 228 can be arranged on the chip 110 for example by paste printing, sol-gel deposition, PVD, CVD, or by means of any other suitable method.

In various embodiments, the semiconductor package 200 can furthermore include an encapsulating material 230, which at least partly covers the chip 110 and the layer 228.

In various embodiments, the encapsulating material 230 may include a conventional encapsulating material (also referred to as encapsulation material). Although it may then be possible to remove the encapsulating material, e.g. wet-chemically, without damaging the chip 110, it may nevertheless be the case, e.g. with ignorance of a presence of the layer 228, that a process is performed in which energy is supplied which exceeds the activation energy of the layer 228, such that in this case, too, an additional protection against an (unauthorized) access to the chip can be provided by the layer 228.

In various embodiments, the encapsulating material 230 can be fashioned, for example with regard to material and arrangement, such that it can be impossible, substantially impossible or difficult (e.g. possible only with great expenditure) to free the chip 110 of the encapsulating material 230 without exceeding the activation energy of the layer 228 in the process.

In various embodiments, the encapsulating material 230 can be arranged above and/or on the chip 110 provided with the layer 228 and on the substrate 116, on which the chip 110 is arranged such that the chip 110 and the layer 228 are hermetically encapsulated by the chip carrier 116 and the encapsulating material 230.

In various embodiments, the encapsulating material 230 may include a highly crosslinked polymer, for example a highly crosslinked polymer as described e.g. in U.S. Pat. No. 7,598,622 B2 or in DE 10 2005 043 657 B4. The highly crosslinked polymer can be substantially resistant to wet-chemical removal of the encapsulating material 230.

In various embodiments, for an attack on the chip 110 it may then be necessary to remove the resistant encapsulating material 230, e.g. the highly crosslinked polymer, by grinding, irradiation by laser and/or plasma etching. In this case, energy can be released or transferred to the chip 110 (and thus also to the layer 228 thermally coupled to the chip 110), which energy can suffice to cause the layer 228 to undergo reaction. To put it another way, the chemically resistant encapsulating material 230 can protect the chip 110 such that removing the encapsulating material 230 from the chip 110 requires processes that transfer energy to the chip 110, such that the activation energy (or activation temperature) of the layer 228 can be exceeded and the exothermic reaction can thus be triggered in the layer 228. The temperature increase brought about as a result at least in a partial region of the chip 110 can render the chip 110 unusable, e.g. partly destroy it.

Figure 2B:
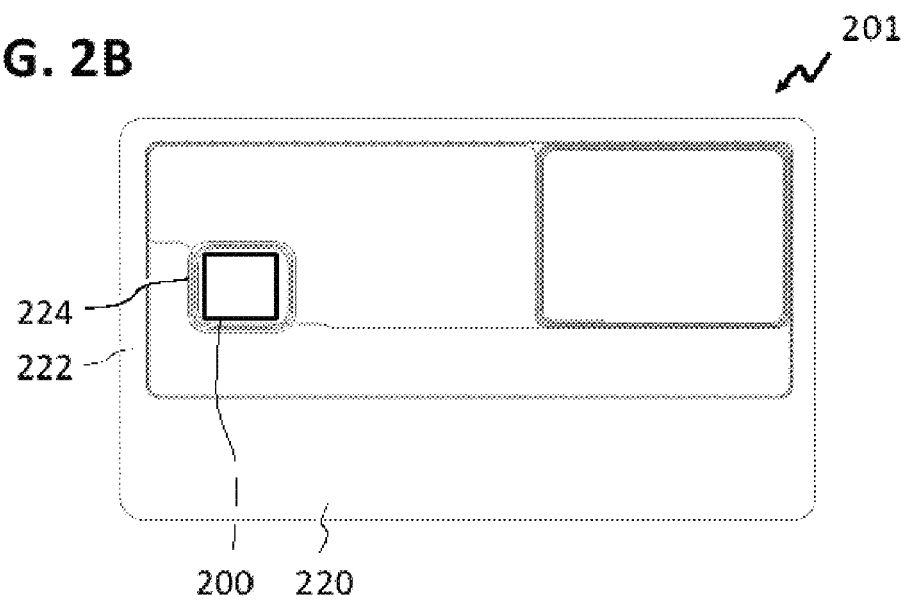
FIG. 2B shows a schematic plan view of a smart card in accordance with various embodiments.

FIG. 2B shows a schematic plan view of a smart card 101 in accordance with various embodiments.

In various embodiments, the smart card 201 may include a smart card body 220 and a semiconductor package 200 formed as a smart card module in accordance with various embodiments.

In various embodiments, the smart card body 220 can be produced in a manner known to the person skilled in the art and include known features and materials.

The smart card module 220 in accordance with various embodiments can be arranged in the smart card body 220.

In various embodiments, as illustrated in FIG. 2B, the smart card 201 can be suitable for contactless communication.

In various embodiments, the smart card can, however, also be suitable exclusively for a contact-based communication or for a both contact-based and contactless communication.

Figure 4:
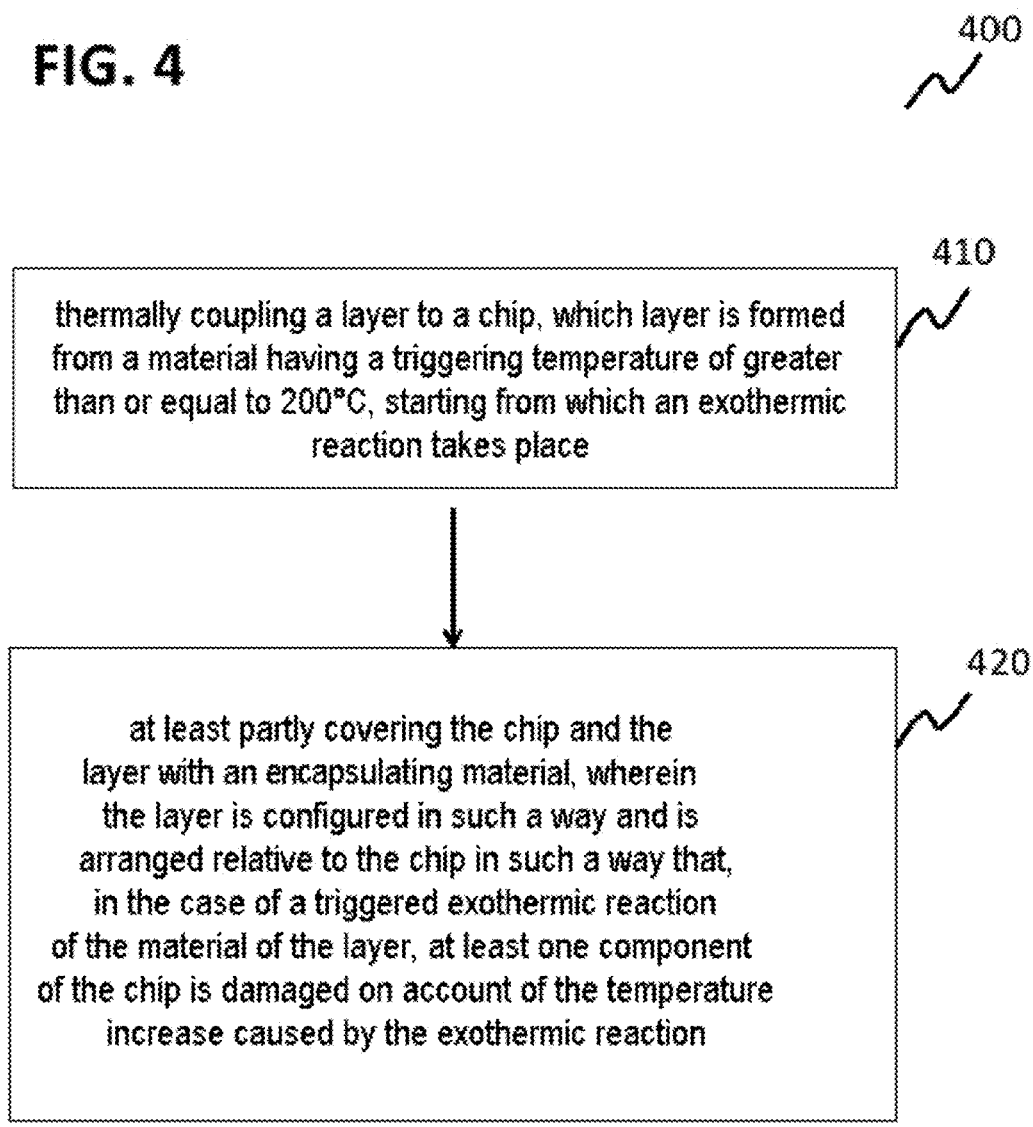
FIG. 4 shows a flow diagram of a method for producing a semiconductor package in accordance with various embodiments.

FIG. 4 shows a flow diagram 400 of a method for producing a semiconductor package in accordance with various embodiments.

In various embodiments, the method may include thermally coupling a layer to a chip (in 410), which layer is formed from a material having a triggering temperature of greater than or equal to 200° C., starting from which an exothermic reaction takes place, and at least partly covering the chip and the layer with an encapsulating material, wherein the layer is configured in such a way and is arranged relative to the chip in such a way that, in the case of a triggered exothermic reaction of the material of the layer, at least one component of the chip is damaged on account of the temperature increase caused by the exothermic reaction (in 420).

In various embodiments, thermally coupling the layer to the chip may include applying the layer directly on a surface of the chip, e.g. on an active side of the chip, by paste printing, sol-gel deposition, PVD or CVD.

In various embodiments, at least partly covering the chip and the layer with the encapsulating material may include arranging the encapsulating material on the chip on which the layer is applied, and a substrate on which the chip is arranged, such that the chip and the layer can be hermetically encapsulated by the chip carrier and the encapsulating material.

Further features and embodiments of the method are evident from the description of the device, and vice versa.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A semiconductor package, comprising:
    a chip;
    a layer which is thermally coupled to the chip and which is formed from a material having a triggering temperature of greater than or equal to 200° C., starting from which an exothermic reaction takes place; and
    an encapsulating material which at least partly covers the chip and the layer;
    wherein the layer is configured in such a way and is arranged relative to the chip in such a way that, in the case of a triggered exothermic reaction of the material of the layer, at least one component of the chip is damaged on account of the temperature increase caused by the exothermic reaction;
    wherein the layer is a thermodynamically metastable inorganic layer, and wherein the material of the thermodynamically metastable inorganic layer is an Li-based compound.

2. The semiconductor package of claim 1,
    wherein the Li-based compound is an Li metal oxide.

3. The semiconductor package of claim 1,
    wherein the Li-based compound is an Li-based compound comprising one or more transition metals.

4. The semiconductor package of claim 1,
    wherein the layer has a layer thickness of at least 10 µm.

5. The semiconductor package of claim 1,
    wherein the encapsulating material comprises or is formed from a highly crosslinked encapsulating material.

6. The semiconductor package of claim 1,
    wherein a temperature increase by at least 400° C. takes place at the at least one component of the chip.

7. The semiconductor package of claim 1,
    wherein, upon triggering of an exothermic reaction of the material of the layer, the triggered exothermic reaction takes place in an oxygen-containing environment.

8. A method for producing a semiconductor package, the method comprising:
    thermally coupling a layer to a chip, which layer is formed from a material having a triggering temperature of greater than or equal to 200° C., starting from which an exothermic reaction takes place; and
    at least partly covering the chip and the layer with an encapsulating material;
    wherein the layer is configured in such a way and is arranged relative to the chip in such a way that, in the case of a triggered exothermic reaction of the material of the layer, at least one component of the chip is damaged on account of the temperature increase caused by the exothermic reaction;
    wherein the layer is a thermodynamically metastable inorganic layer, and wherein the material of the thermodynamically metastable inorganic layer is an Li-based compound.

9. A smart card, comprising:
    a smart card body; and
    a semiconductor package, comprising:
        a chip;
        a layer which is thermally coupled to the chip and which is formed from a material having a triggering temperature of greater than or equal to 200° C., starting from which an exothermic reaction takes place; and
        an encapsulating material which at least partly covers the chip and the layer;
        wherein the layer is configured in such a way and is arranged relative to the chip in such a way that, in the case of a triggered exothermic reaction of the material of the layer, at least one component of the chip is damaged on account of the temperature increase caused by the exothermic reaction;
        wherein the layer is a thermodynamically metastable inorganic layer, and wherein the material of the thermodynamically metastable inorganic layer is an Li-based compound.

* * * * *